US007120987B2

(12) United States Patent
Liu et al.

(10) Patent No.: US 7,120,987 B2
(45) Date of Patent: Oct. 17, 2006

(54) METHOD OF MAKING RFID DEVICE

(75) Inventors: Peikang Liu, Claremont, CA (US); Steven C. Kennedy, Fontana, CA (US); Christine U. Dang, Garden Grove, CA (US); Scott Wayne Ferguson, Arcadia, CA (US); Jason D. Munn, West Covina, CA (US)

(73) Assignee: Avery Dennison Corporation, Pasadena, CA (US)

( * ) Notice: Subject to any disclaimer, the term of this patent is extended or adjusted under 35 U.S.C. 154(b) by 336 days.

(21) Appl. No.: 10/634,243

(22) Filed: Aug. 5, 2003

(65) Prior Publication Data

US 2005/0032267 A1    Feb. 10, 2005

(51) Int. Cl.
*H01Q 13/00* (2006.01)
*H01Q 1/38* (2006.01)

(52) U.S. Cl. .................. 29/600; 29/825; 29/832; 29/601; 29/592.1; 343/867; 343/700 MS; 340/572.7

(58) Field of Classification Search ............... 29/600, 29/602.1, 825, 832, 874; 343/895, 873, 700 MS; 361/737, 748; 235/441, 488, 492; 340/572.7
See application file for complete search history.

(56) References Cited

U.S. PATENT DOCUMENTS

| | | | | |
|---|---|---|---|---|
| 3,944,777 | A * | 3/1976 | Porat | 219/118 |
| 5,430,441 | A * | 7/1995 | Bickley et al. | 340/572.7 |
| 5,892,661 | A * | 4/1999 | Stafford et al. | 361/737 |
| 6,018,299 | A * | 1/2000 | Eberhardt | 340/572.7 |
| 6,100,804 | A * | 8/2000 | Brady et al. | 340/572.7 |
| 6,136,693 | A | 10/2000 | Chan et al. | |
| 6,145,901 | A | 11/2000 | Rich | |
| 6,181,287 | B1 | 1/2001 | Beigel | |
| 6,268,016 | B1 | 7/2001 | Bhatt et al. | |
| 6,476,775 | B1 | 11/2002 | Oberle | |
| 6,518,885 | B1 | 2/2003 | Brady et al. | |
| 6,624,362 | B1 | 9/2003 | Müller | |
| 2002/0018880 | A1 * | 2/2002 | Young | 428/209 |
| 2005/0032267 | A1 * | 2/2005 | Liu et al. | 438/57 |

FOREIGN PATENT DOCUMENTS

| | | |
|---|---|---|
| EP | 0 818 752 | 1/1998 |
| EP | 1 039 543 | 9/2000 |
| WO | 01/71686 | 9/2001 |
| WO | WO 03/012734 | 2/2003 |
| WO | 03/056509 | 7/2003 |

* cited by examiner

*Primary Examiner*—Minh Trinh
(74) *Attorney, Agent, or Firm*—Renner, Otto, Boisselle & Sklar, LLP (57) ABSTRACT

A radio frequency identification (RFID) device includes a conductive pattern, such as an antenna, on one side of a substrate, and a chip, such as part of a strap, electrically coupled to the conductive pattern, and either on an opposite side of the substrate or on the same side of the substrate as the antenna. A method of fabricating the RFID device may include crimping the strap onto the substrate, in contact with a seed layer, which is subsequently used in forming the antenna or other conductive pattern by plating. The seed layer may be a patterned conductive ink layer. Alternatively, the seed layer may be a layer of conductive material deposited on the substrate, such as by vacuum deposition. Parts of the deposited layer may be covered with a patterned mask in order to form the desired configuration of the conductive pattern.

37 Claims, 8 Drawing Sheets

METHOD OF MAKING RFID DEVICE

TECHNICAL FIELD OF THE INVENTION

The invention relates radio frequency identification (RFID) devices and methods of making such devices.

DESCRIPTION OF THE RELATED ART

Radio frequency identification (RFID) tags and labels (collectively referred to herein as "devices") are widely used to associate an object with an identification code or other information. RFID devices generally have a combination of antennas (a conductive pattern) and analog and/or digital electronics, which may include for example communications electronics, data memory, and control logic. For example, RFID tags are used in conjunction with security locks in cars, for access control to buildings, and for tracking inventory and parcels. Some examples of RFID tags and labels appear in U.S. Pat. Nos. 6,107,920, 6,206,292, and 6,262,292, all of which are hereby incorporated by reference in their entireties.

As noted above, RFID devices are generally categorized as labels or tags. RFID labels are RFID devices that are adhesively or otherwise have a surface attached directly to objects. RFID tags, in contrast, are secured to objects by other means, for example by use of a plastic fastener, string or other fastening means.

One goal in the fabrication of RFID devices is improving methods by which such devices are fabricated.

SUMMARY OF THE INVENTION

According to an aspect of the invention, an RFID device has an antenna and a strap. The antenna and the strap are electrically coupled together via crimped connections.

According to another aspect of the invention, a method of making an RFID device includes forming a seed material on a substrate, and attaching a strap to the substrate, wherein the strap is electrically coupled to the seed layer via conductive connections through the substrate.

According to yet another aspect of the invention, a method of making an RFID device includes depositing a metal layer on a substrate, covering portions of the metal layer with a patterned mask of dielectric material, and plating to form an antenna on the uncovered portions of the metal layer.

According to still another aspect of the invention, a method of making a radio frequency identification (RFID) device, includes: forming a conductive seed layer on a substrate; and attaching a strap to the substrate, wherein the attaching includes crimping to form crimped electrical connections between the seed layer and conductive leads of the strap.

According to a further aspect of the invention, a radio frequency identification (RFID) device includes a substrate; a patterned conductive layer on the substrate; a strap; and at least one crimped electrical connection between the strap and the patterned conductive layer.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

In the annexed drawings, which are not necessarily to scale.

DETAILED DESCRIPTION

A radio frequency identification (RFID) device includes a conductive pattern, such as an antenna, on one side of a substrate, and a chip, such as part of a strap, electrically coupled to the conductive pattern, and either on an opposite side of the substrate or on the same side of the substrate as the antenna. A method of fabricating the RFID device may include crimping the strap onto the substrate, in contact with a seed layer, which is subsequently used in forming the antenna or other conductive pattern by plating. The seed layer may be a patterned conductive ink layer. Alternatively, the seed layer may be a layer of conductive material deposited on the substrate, such as by vacuum deposition. Parts of the deposited layer may be covered with a patterned mask in order to form the desired configuration of the conductive pattern. Subsequent to the plating, the mask may be removed, and etching may be performed to remove parts of the deposited layer that are not plated because they were covered by the mask.

Figure 1:
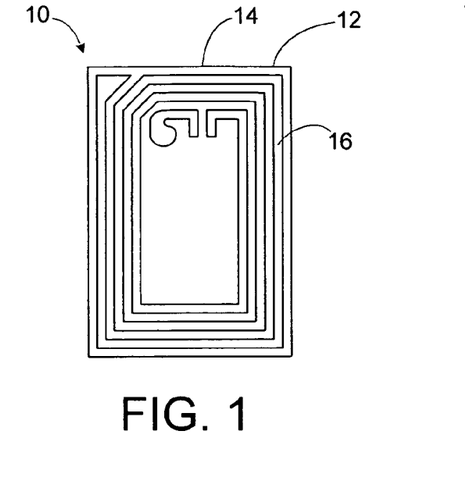
FIG. 1 is a plan view of an RFID device in accordance with the present invention.
Figure 3:
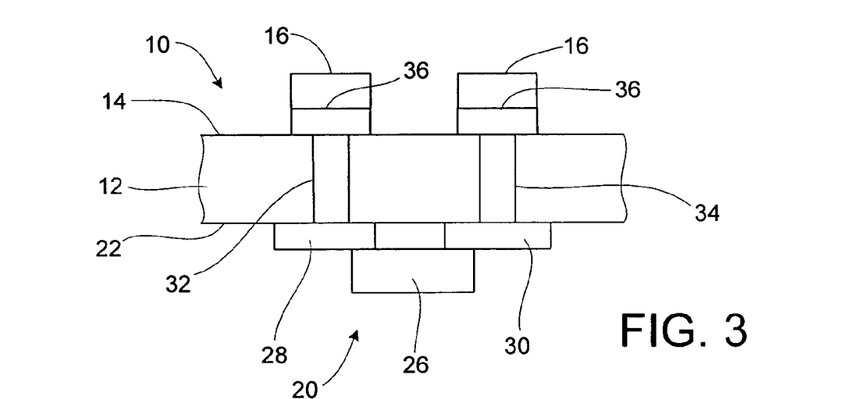
FIG. 3 is a side cross-sectional view of part of the RFID device of FIG. 1.

Referring initially to FIG. 1, a radio frequency identification (RFID) device 10 having a substrate 12 is shown. As shown in FIGS. 1 and 3, on a first or front surface or face 14 of the substrate 12, the RFID device 10 has a conductive pattern such as an antenna 16.

A strap 20 is on a back or second surface or face 22 of the substrate 12. The strap 20 includes a chip 26 and conductive leads 28 and 30. The conductive leads 28 and 30 are electrically connected to the antenna 16, through the substrate 12, via conductive crimped connections 32 and 34, respectively. The crimped connections 32 and 34 are connected to a seed material or layer 36, upon which the antenna 16 is formed, such as by plating. As described further below, the seed material 36 may be a conductive ink, or may be a deposited material, such as copper placed on the front surface 14 of the substrate 12 by vapor deposition.

FIG. 3 shows a generalized representation of the crimped connections 32 and 34. Various embodiments of the crimped connections 32 and 34 are discussed in greater detail below.

Figure 2:
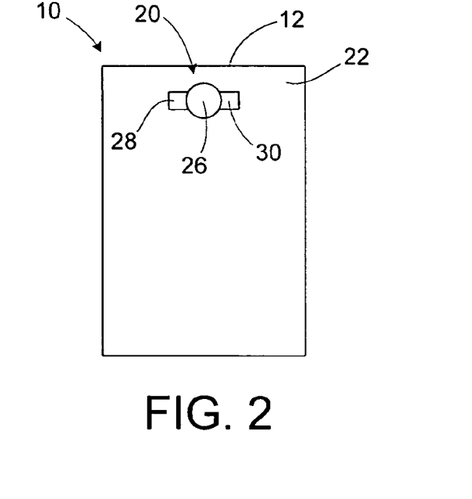
FIG. 2 is a bottom view of the RFID device of FIG. 1.

Although FIGS. 1–3 illustrate an embodiment with the strap 20 on the second face 22 of the substrate 12, it will be appreciated that the alternatively strap 20 may be on the first face 14, the same side of the substrate 12 as the antenna 16.

Examples of suitable materials for the substrate 12 include paper and suitable polymers such as polycarbonate, polyvinyl chloride, polystyrene, polymethyl methacrylate, polyurethane polyimide, polyester, cyclic polyolefin polymers, polyether sulfone (PES), polyethylene terephthalate (PET), polyethylene naphthalate, polycarbonate, polybutylene terephthalate, polyphenylene sulfide (PPS), polypropylene, polysulfone, aramid, polyamide-imide (PAI), polyimide, aromatic polyimides, polyetherimide, acrylonitrile butadiene styrene, and polyvinyl chloride. Further details regarding suitable substrates and substrate materials may be found in International Publication Nos. WO 00/46854, WO 00/49421, WO 00/49658, WO 00/55915, and WO 00/55916, the entire disclosures of which are herein incorporated by reference.

The leads 28 and 30 of the strap 20 operatively coupled to chip contacts of the chip 26. The chip 26 may include any of a variety of suitable electronic components, such as the circuitry described above for modulating the impedance of the RFID device 10. The leads 28 and 30 may be completely made out of an electrically conducting material, such as being made out of a metal foil. Alternatively, the leads 28 and 30 may include an electrically insulating material, for example being plastic coated with metal. The strap 20 may include a strap substrate that is attached to the leads 28 and 30. The strap substrate may be made of any of a variety of suitable materials, for example, suitable flexible polymeric materials such as PET, polypropylene or other polyolefins, polycarbonate, or polysulfone.

The strap 20 may be any of a variety of commercially-available straps. The term "strap," as used herein, refers broadly to devices that include a microchip or other electronic circuitry, coupled to conductive leads. The conductive leads may be connected to contacts on the microchip or other circuitry by any of a variety of suitable methods. The conductive leads may include of any of a variety of suitable conductive materials, such as metal strips or deposited conductive ink layers. Examples include an RFID strap available from Alien Technologies, and the strap marketed under the name I-CONNECT, available from Philips Electronics. Alternatively, the strap 20 may be other than a commercially-available strap.

The crimped connections 32 and 34 may include conductive material from the seed material 36 or from the conductive leads 28 and 30. In addition, the crimped connections 32 and 34 may include conductive material added during the plating process used to form the antenna 16. For example, the plating may partially or completely fill, with conductive material, holes made during the crimping process. Such additional plated conductive material may make or strengthen the conductive connection between the antenna 16 and the conductive leads 28 and 30.

Figure 3A:
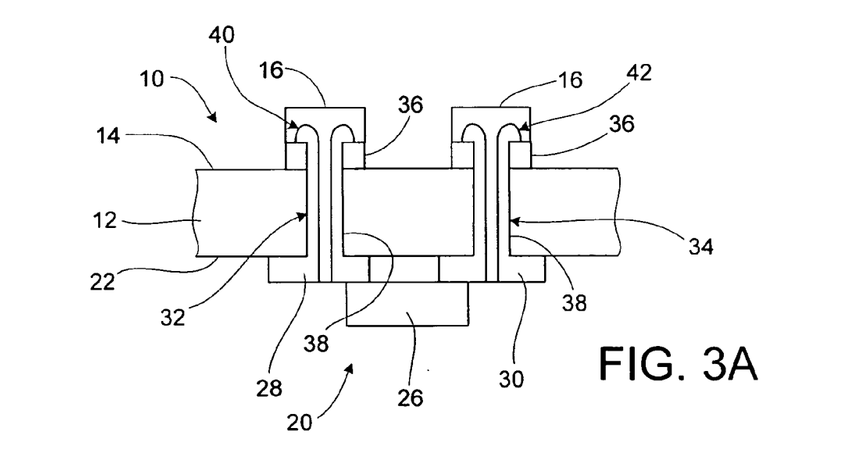
FIG. 3A is a side cross-sectional view of part of a first embodiment of the RFID device of FIG. 1.

FIGS. 3A–3G show details of various embodiments of the crimped connections 32 and 34 between the conductive leads 28 and 30, and the seed material 36. In FIG. 3A the crimped connections 32 and 34 are formed by driving conductive material 38 (parts of the conductive leads 28 and 30), which may be made of metal, through the substrate 12. The conductive material 38 may be driven through the substrate 12 by a pierce or punch that passes through the conductive leads 28 and 30, and the substrate 12. The conductive material 38 may be bent to form crowns 40 and 42 in contact with the seed layer 36. Subsequent plating may add material and strengthen the connections between the conductive material 38 and the seed layer 36, and/or between the conductive material 38 and the remaining parts of the conductive leads 28 and 30. Plated material may form in the hole left by the punch or pierce, and may fill physical gaps between conductive materials, and/or provide a physically and electrically stronger path between the conductive leads 28 and 30, and the seed layer 36.

Figure 3B:
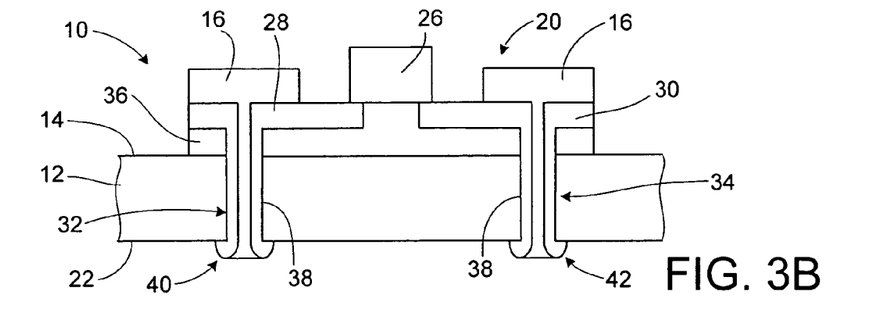
FIG. 3B is a side cross-sectional view of part of a second embodiment of the RFID device of FIG. 1.

FIG. 3B shows the crimped connections 32 and 34 on the first or front side 14 of the substrate 12. A pierce or punch is used the drive conductive material 38 of the conductive leads 28 and 30 through the seed layer 36 and the substrate 12. The driving of the conductive material 38 secures the conductive leads in contact with the seed layer 36. In addition, the conductive material 38 may make electrical connections between the conductive leads 28 and 30, and corresponding parts of the seed layer 36. Subsequent plating may fill gaps between the conductive leads 28 and 30 and the seed material 36 with additional conductive plated material, thereby improving the electrical connection, for example by reducing resistance or improving reliability of the contact. In addition, plating may provide an additional connection between the seed layer 36 and edges of the conductive leads 28 and 30.

The straps 20 used in the connections shown in FIGS. 3A and 3B may have metal conductive leads 28 and 30. An example of such a strap is the I-CONNECT strap referred to above.

Figure 3C:
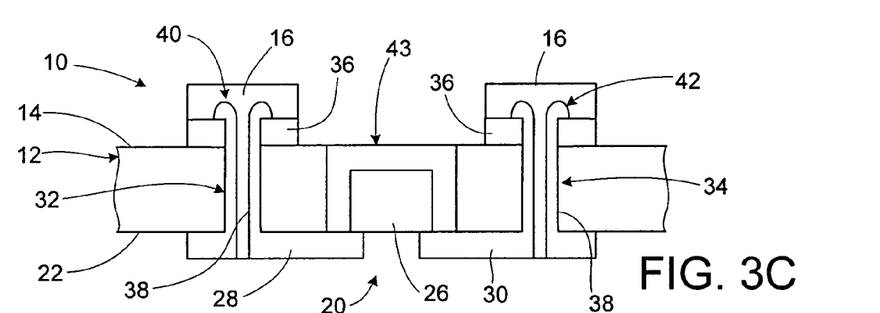
FIG. 3C is a side cross-sectional view of part of a third embodiment of the RFID device of FIG. 1.
Figure 3D:
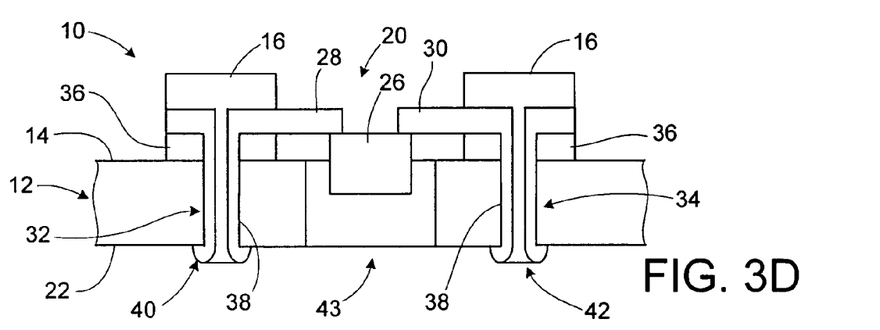
FIG. 3D is a side cross-sectional view of part of a fourth embodiment of the RFID device of FIG. 1.

FIGS. 3C and 3D show alternative configurations, each differing from those shown in FIGS. 3A and 3B in that a potion of the strap 20 resides in a hole 43 in the substrate 12. The hole 43 may be made, for example, by punching, to remove a part of the substrate 12 at a suitable location. It will be appreciated that by locating a portion of the strap 20 in the hole 43, the strap 20 may have a lower profile on the substrate 12. The may make for a less obtrusive device, and/or may facilitate subsequent fabrication operations.

Figure 3E:
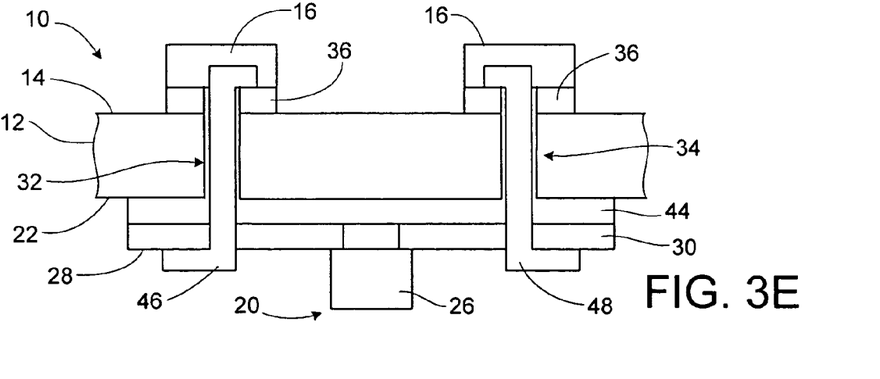
FIG. 3E is a side cross-sectional view of part of a fifth embodiment of the RFID device of FIG. 1.

In FIG. 3E the strap 20 had a strap substrate 44 upon which the conductive leads 28 and 30 are located. The strap substrate may be a suitable polymer material, such as those discussed above with regard to the substrate 12. The conductive leads may be formed from a suitable conductive ink material. An example of such a strap is the Alien strap referred to above.

In making the crimped connections 32 and 34, thin metal rods 46 and 48 pierce the conductive leads 26 and 28, the strap substrate 44, the substrate 12, and the seed layer 36. The ends of the rods 46 and 48 are then bent to secure the strap 20 to the substrate 12, and to make contact with the conductive leads 26 and 28, and the seed layer 36. Subsequent plating strengthens the connections between the rods 46 and 48, and the conductive leads 26 and 28 on one side, and the seed layer 36 on the other side.

The metal rods 46 and 48 may include a suitable conductive metal, such as copper and/or nickel. The metal rods 46 and 48 may have a rectangular cross-section shape, for example 2 mm×0.5 mm. However, it will be appreciated that the metal rods 46 and 48 may have a variety of cross-sectional shapes and dimensions.

Figure 3F:
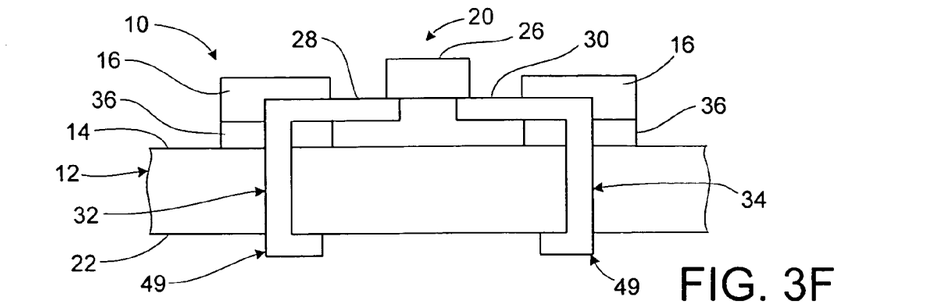
FIG. 3F is a side cross-sectional view of part of a sixth embodiment of the RFID device of FIG. 1.
Figure 3G:
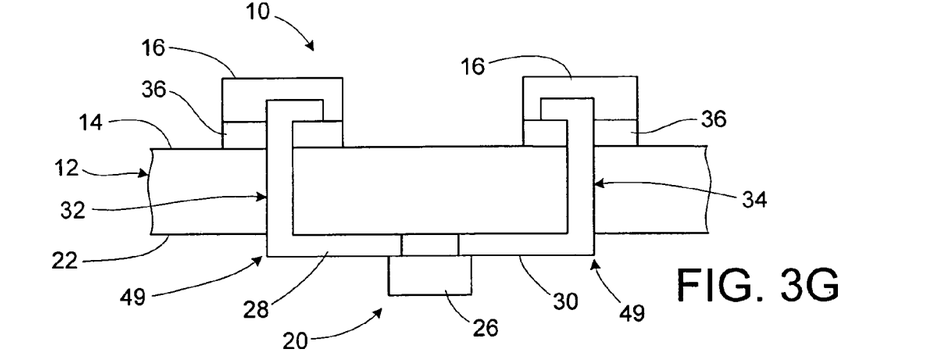
FIG. 3G is a side cross-sectional view of part of a seventh embodiment of the RFID device of FIG. 1.

FIGS. 3F and 3G shows two other configuration for the crimped connections 32 and 34. The substrate 12 and the seed layer 36 have slits or holes 49 cut therethrough. The conductive leads 28 and 30 are themselves inserted through the slits or holes 49, with ends of the leads 28 and 30 being bent (crimped) to secure the strap 22 to the rest of the device 10. Contact between the leads 28 and 30, and the seed layer 36 forms electrical connections. The electrical connection may be mechanically and/or electrically reinforced by subsequent plating. The strap 20 may be attached on the same side of the substrate 12 as the seed layer 36 (FIG. 3F), or on an opposite side of the substrate 12 as the seed layer 36 (FIG. 3G).

Figures 4, 5:
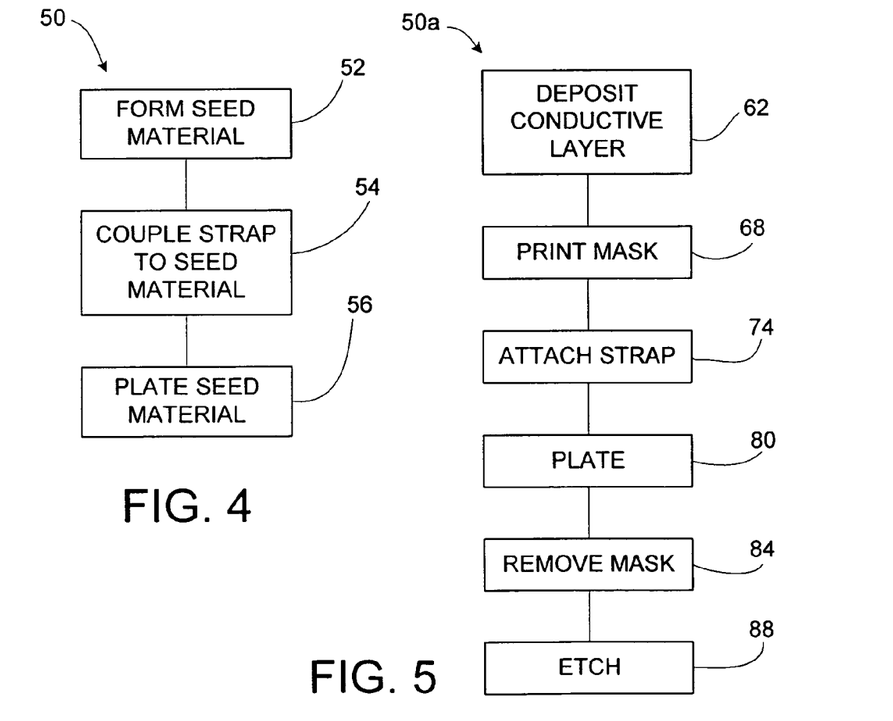
FIG. 4 is a high-level flowchart of a method in accordance with the present invention for producing the RFID device of FIG. 1.
FIG. 5 is a flowchart of one embodiment of the method of FIG. 4.
Figure 6:
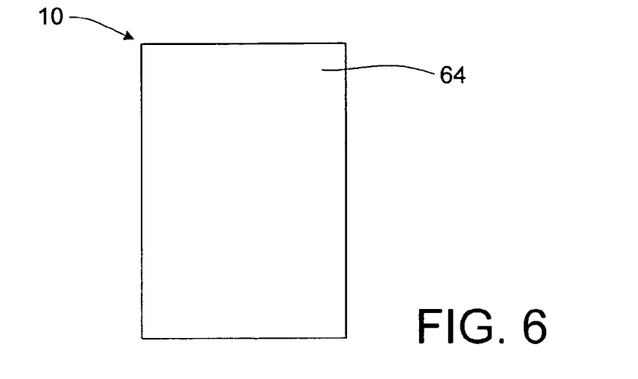
FIG. 6 is a plan view of a first step in the method of FIG. 5.
Figure 7:
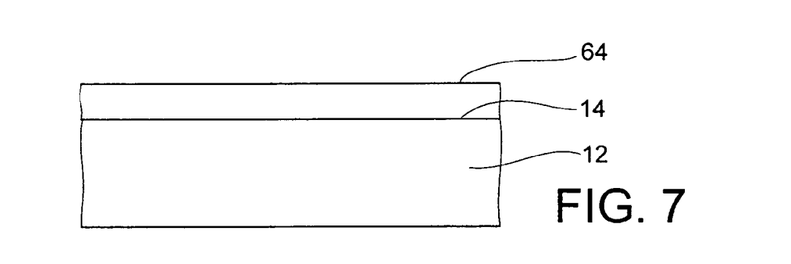
FIG. 7 is a side cross-sectional view of the first step.

FIG. 4 shows a high-level flow chart of broad outlines of a method 50 for fabricating the RFID device 10. In step 52, the seed material 36 is formed on the front surface 14 of the substrate 12. As will be described below in greater detail, the seed material 36 may be a patterned conductive ink, or may be a substantially-uniform layer of conductive material, such as vapor deposited copper, with a patterned mask thereupon.

In step 54, the strap 20 is connected to either to the front 14 or to the back 22 of the substrate 12 and is electrically coupled to the seed material 36 by a crimping operation. Finally, in step 56, the antenna 16 or other conductive pattern is formed upon the seed layer 36, using a suitable plating process, such as a suitable electroplating process.

The general outline of the method 50 having just been given, details are now given of a pair of specific embodiments of the method 50. FIG. 5 shows a high-level flowchart of a method 50a that involves a vacuum-deposited metal layer. FIGS. 6–15 illustrate some of the operations of the method 50a.

In step 62 of the method 50a, a layer 64 of conductive material is deposited on the front surface or face 14 of the substrate 12. In a particular embodiment, the deposited layer 64 may be vacuum-deposited copper having a thickness of about 2000 Angstroms, or more broadly from about 100 Angstroms to about 10,000 Angstroms. As an alternative to copper, the deposited material may include any of a variety of suitable conductive metals, for example aluminum and/or nickel. It will be appreciated that other suitable conductive materials may be employed in the deposited layer 64.

The deposition of the deposited layer 64 may utilize any of a variety of methods, including vapor or vacuum deposition, sputtering, physical vapor deposition, chemical vapor deposition, or other suitable processes.

Figure 8:
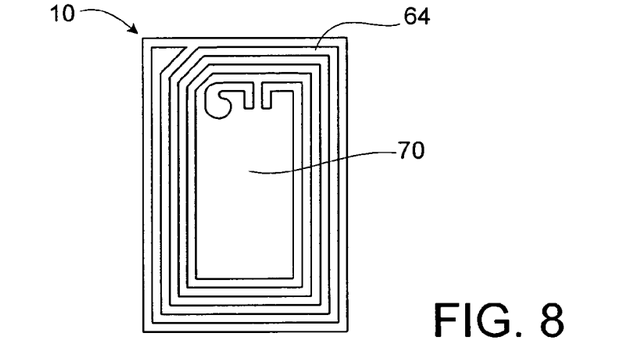
FIG. 8 is a plan view of a second step in the method of FIG. 5.
Figure 9:
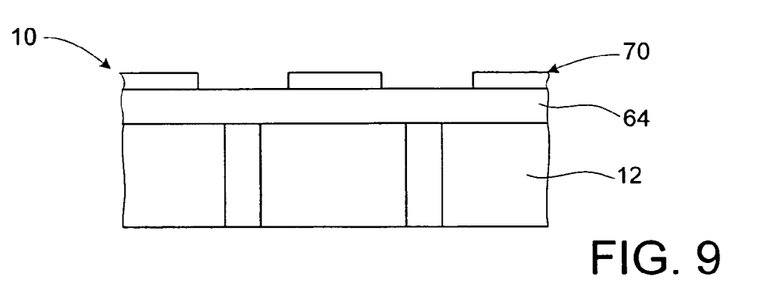
FIG. 9 is a side cross-sectional view of the second step.

In step 68, illustrated in FIGS. 8 and 9, a patterned mask 70 is printed or otherwise formed on the deposited layer 64, masking portions of the deposited layer 64 upon which plating is not desired. The portions of the deposited layer 64 left exposed after formation of the mask 70 correspond to the pattern of the antenna 16 to be formed in a subsequent step. The pattern of the mask 70 thus may be a reverse image of the antenna or other conductive pattern 16 to be formed.

The printing in step 68 may be any of a variety of suitable printing processes, including inkjet printing, flexo printing, gravure printing, or screen printing.

The ink or other material of the mask 70 is any suitable non-conductive material. The material for the mask 70 may be any of a variety of suitable materials such as suitable oils, or resist materials such as photoresist. The mask 70 may include a material that is alkaline-strippable or is soluble in another suitable solvent for removing the mask 70. Examples of suitable alkaline-soluble resists include Enthone PR3011, available from Ethone, Inc., and CGSN 7005, available from Coated Circuit Products of England. Examples of suitable soluble resists include Enthone PR4011, available from Ethone, Inc., and CGSN 7011, available from Coated Circuit Products.

It will be appreciated that, in order to make for a more efficient process, the mask 70 may be merely printed in a patterned print upon the conductive deposited layer 64. Alternatively, the mask 70 may be formed in a variety of other suitable ways, such as coating with a resist material, followed by selectively removing portions of the resist material to expose parts of the underlying conductive deposited layer 64. The methods of selectively removing portions of a material may include suitable lithographic methods.

Figure 10:
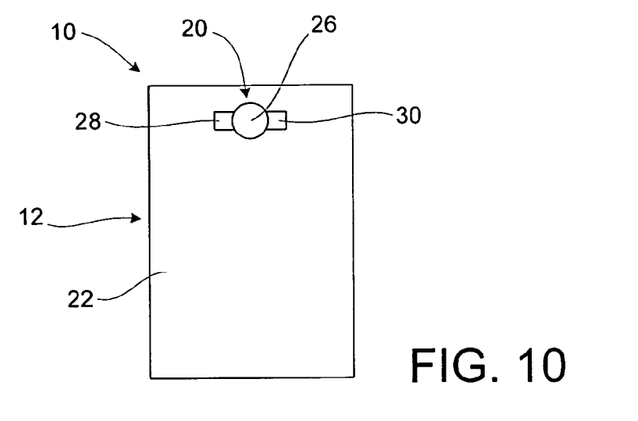
FIG. 10 is a bottom view of a third step of the method of FIG. 5.
Figure 11:
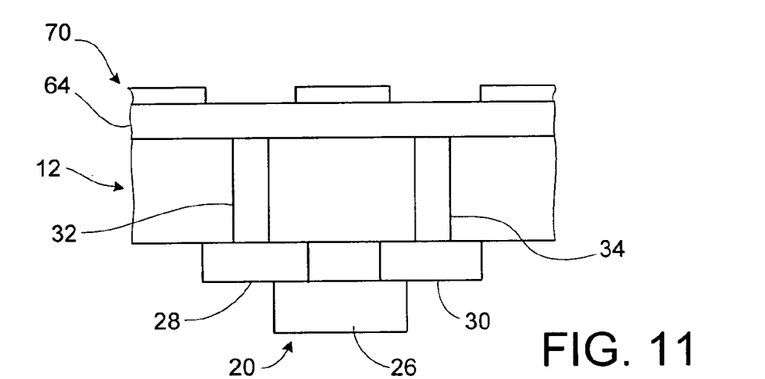
FIG. 11 is a side cross-sectional view of the third step.

Thereafter, in step 74, the strap 20 is crimped substrate 12, as illustrated in FIGS. 10 and 11. As illustrated, the strap 20 is crimped onto the back surface 22 of the substrate 12, but it will be appreciated that alternatively the strap may be crimped to the front surface 14 of the substrate 12. The crimping provides electrical crimped connections 32 and 34 between conductive leads 28 and 30 of the strap 20, and the deposited layer 64. As seen in FIG. 11, the crimped connections correspond to exposed portions 76 and 78 of the deposited layer 64, that is, portions not covered by the mask 70.

The crimping may be performed to make the crimped connections 32 and 34 shown in FIG. 3A and discussed above, by using a pierce to drive conductive material from the conductive leads through the substrate 12 and the seed layer 36, and by using a cone-shaped device to form the crowns 40 and 42 (FIG. 3A).

The crimping to make the crimped connections 32 and 34 shown in FIG. 3E may be made by using a device similar to a stapler to drive the metal rods 46 and 48 (FIG. 3E) through the device 10, and bend the ends of the metal rods 46 and 48 to bring them into contact with the seed material 36 and the conductive leads 26 and 28. In fact, standard staples and a standard stapler may be used to make crimped connections similar to those shown in FIG. 3E.

Other of the various connections shown in FIGS. 3A–3G may be made by suitable methods.

As shown in FIG. 11, the strap 20 may be located relative to the substrate 12 such that the chip 26 of the strap 20 is facing away from the substrate. It will be appreciated that other configurations are possible, for example, with the strap 20 facing towards the back surface 22 of the substrate 12, or with the chip 26 being embedded within the strap 20.

Figure 12:
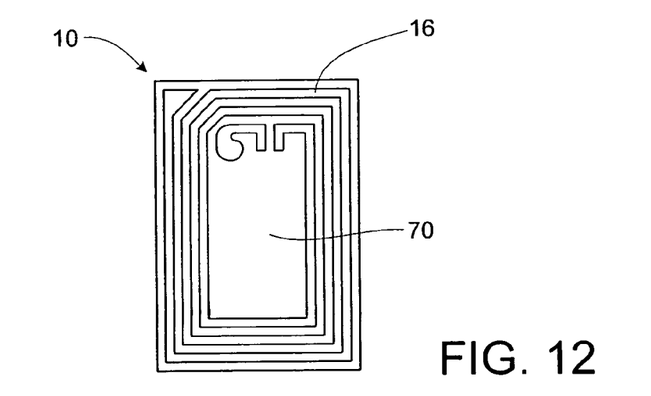
FIG. 12 is a plan view of a fourth step of the method of FIG. 5.
Figure 13:
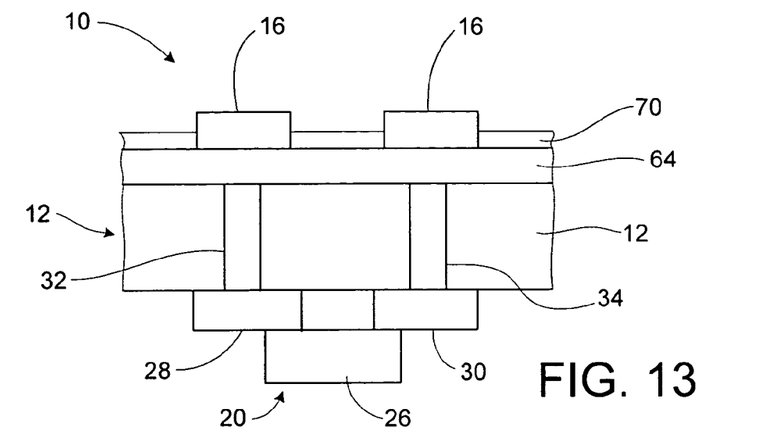
FIG. 13 is a side cross-sectional view of the fourth step.

In step 80, illustrated in FIGS. 12 and 13, a plating process is used to form the antenna or other patterned conductive layer 16. The substantially-uniform deposited conductive layer 64 provides a way of dividing even current flow across the exposed areas (such as the regions 76 and 78) of the deposited layer 64. Thus, a substantially uniform thickness may be obtained in the antenna or other conductive pattern 16 formed by the electroplating process.

Copper may be plated to form the antenna or other conductive pattern 16. Also, the material to be plated may be selected so as to be the same as the material of the conductive deposited layer 64.

The substantially uniform conductive deposited layer 64 provides a low electrical resistance when used in the plating process to form the antenna or other conductive pattern 16.

Figure 14:
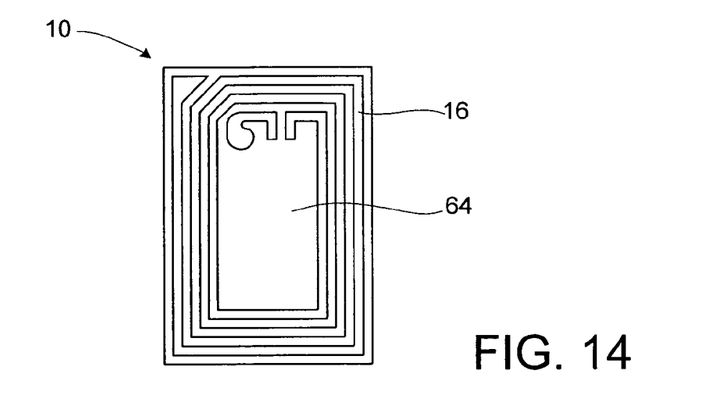
FIG. 14 is a plan view of a fifth step of the method of FIG. 5.
Figure 15:
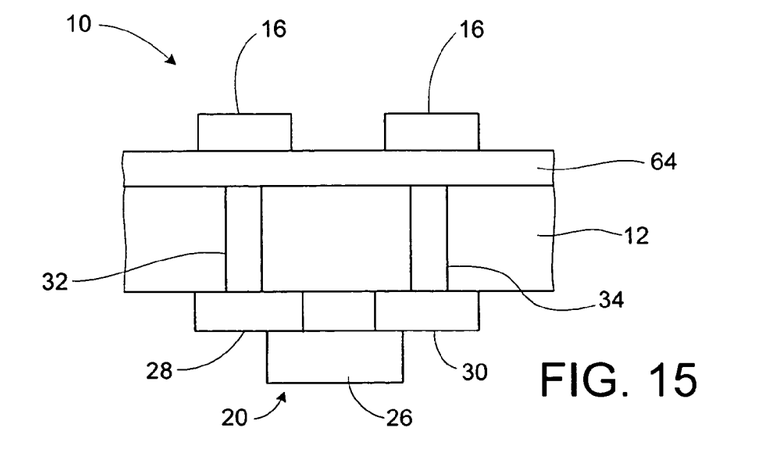
FIG. 15 is a side cross-sectional view of the fifth step.

In step 84, illustrated in FIGS. 14 and 15, the mask 70 is removed. The mask 70 may be removed by any of a variety of suitable processes, for example, by washing the RFID device 10 using a suitable solvent. As noted above, the mask 70 may include an alkaline-strippable material, which may be removed merely by washing with an alkaline solution.

Finally, in step 88, etching is performed to remove portions of the deposited layer 64 not covered by the antenna or other conductive pattern 16. The etching may be accomplished by any variety of suitable etching processes, for example including exposure to a liquid, such as an acid that removes the copper or other material of the deposited layer 64. An example of a suitable etchant is a suitable ferrous chloride aqueous solution. As an alternative to wet etching, other suitable methods of etching may be employed, such as dry etching, plasma etching, or reactive ion etching.

The etching may remove some of the material of the antenna or other conductive pattern 16. However, the duration of the etching and/or concentration of the etchant may be controlled, so as to limit the amount of material removed from the antenna or other conductive pattern 16, while desirably removing the portions of the conductive deposited layer 64 that are not covered by the antenna or other conductive pattern 16.

The resulting structure of the RFID device, following the etching in step 88, may be substantially similar to that of the RFID device 10 shown in FIGS. 1–3 and discussed above. It will be appreciated that, although the antenna or other patterned conductive layer 16 is shown in FIGS. 1–3 as being separate from the underlying seed layer 36, in fact the electroplated material of the antenna or other conductive pattern 16 may form a unitary conductive pattern with the underlying portions of the deposited conductive layer 64.

Following the etching step 88, a suitable wash may be utilized to remove traces of the wet etchant material employed.

It will be appreciated that many other suitable processes may be undertaken in transforming the RFID device into a tag or label suitable for use. Other layers may be added, for example, such as adhesive layers, printable coating layers, or seeding layers. Additional devices may be included on the substrate 12, or may be coupled to the RFID device 10.

Further it will be appreciated that there may be some variation in the order of steps from that illustrated in FIG. 5. For example, as illustrated, the attaching of the strap 20 occurs after the printing of the mask 70. However, it will be appreciated that the printing of the mask 70 may occur after attachment of the strap 20, if desired. It will be appreciated that other suitable modifications may be made to the method 50a shown in FIG. 5 and discussed above. Such modifications may include, for example, changing the order of steps, adding additional steps, combining multiple of the steps into a single process, or splitting suitable of the steps into multiple sub-operations.

Figure 16:
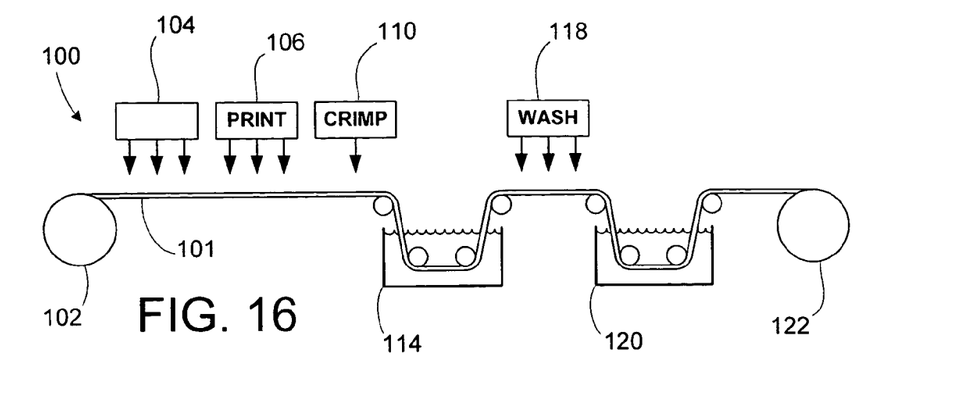
FIG. 16 is a schematic view of a system for carrying out the method of FIG. 5.

With reference now to FIG. 16, some or all of the processes of the method 50a may be performed in one or more roll-to-roll operations. FIG. 16 shows a system 100 for performing the method 50a in a roll-to-roll process. In the system 100, substrate material 101 starts at a supply roll 102. The conductive layer 64 is then deposited at a deposition station 104, with the mask 70 printed at a printer 106. The strap 20 may then be crimped onto a back surface of the substrate material 101 using a crimper 110. It will be appreciated that individual of the straps 20 may be brought to the substrate material 101 through any of a variety of suitable methods. For example, a pick-and-place operation may be used to place the strap 20 in a desired position on the substrate 12. Reference marks may be utilized to aid in proper alignment of the strap 20 relative to the exposed portions of the conductive deposited layer 64. Alternatively, the strap 20 may be temporarily separated on a separate web of material that is brought into contact with the web of substrate material 101 at the desired location.

Following the crimping, the antenna or other conductive pattern 16 is formed in a plating process, for example, by passing the substrate material 101 through a plating bath 114. The mask may then be removed in a solvent washing application process shown at reference number 118. Then a wet etching may be performed by passing the substrate material 101 through an etch bath 120. Finally, the substrate material 101 may be gathered in a take-up roll 122.

Further processing may then be performed on the web of substrate material 101. As noted above, additional layers or structures may be added. Also, the individual RFID devices 10 may be physically separated from one another and from the web substrate material 101, by a suitable cutting process.

Figure 17:
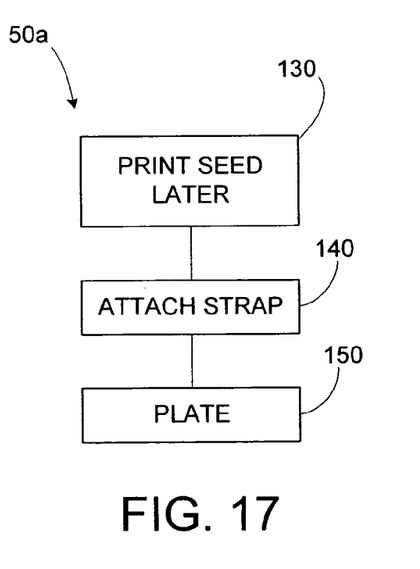
FIG. 17 is a flowchart of a second embodiment of the method of FIG. 4.

Turning now to another embodiment of the method 50, FIG. 17 shows a method 50b for forming the RFID device 10. FIGS. 18–21 illustrate various processes of the method 50b.

Figure 18:
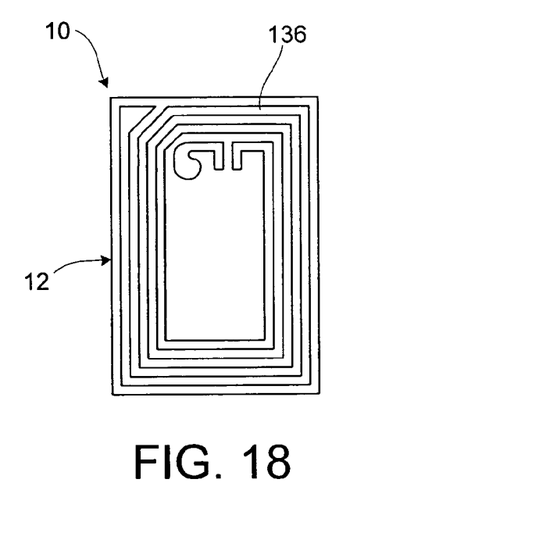
FIG. 18 is a plan view of a first step of the method of FIG. 17.
Figure 19:
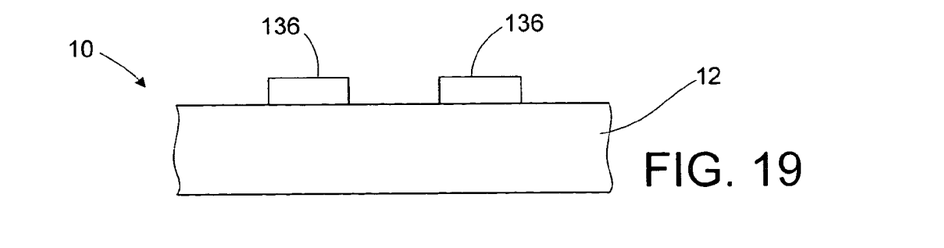
FIG. 19 is a side cross-sectional view of the first step.

In step 130 of the method 50b, a patterned seed layer 136 is printed or otherwise formed on the front surface 14 of the substrate 12, as illustrated in FIGS. 18 and 19. The seed layer 136 may be printed by any of a variety of suitable printing methods, including screen printing, inkjet printing, or gravure printing. The ink may be any of a variety of suitable conductive inks, for example, an ink containing copper and/or silver particles. Other suitable inks may include inks containing other types of conductive metal particles, or inks containing other conductive materials, such as graphite or suitable conductive polymer materials.

Other methods of forming the patterned seed layer includes patterned vapor deposition of a suitable metal, such as copper. Further details on such a process may be found in U.S. Published Application No. 2002/0018880, which is herein incorporated by reference in its entirety.

The seed layer 136 corresponds to the desired configuration of the antenna or other conductive pattern 16. In addition, the seed layer 136 may have additional elements to provide electrical connection between various parts of the seed layer 136, so as to allow a more uniform electroplating process in a subsequent step. For example, if the antenna 16 is an antenna for a 13.56 MHz RFID device, the antenna may have a length large enough such that electrical connection between elements of the antenna 16 is desirable. One method of making such a temporary electrical connection is described in U.S. Pat. No. 6,476,775, which is herein incorporated by reference in its entirety. On the other had, if the antenna 16 is a dipole antenna, such as the type used for UHF or microwave RFID devices, operating for example at 900 MHz or 2.45 GHz, there may be no need for an additional electrical connection between elements or parts of the antenna.

Figure 20:
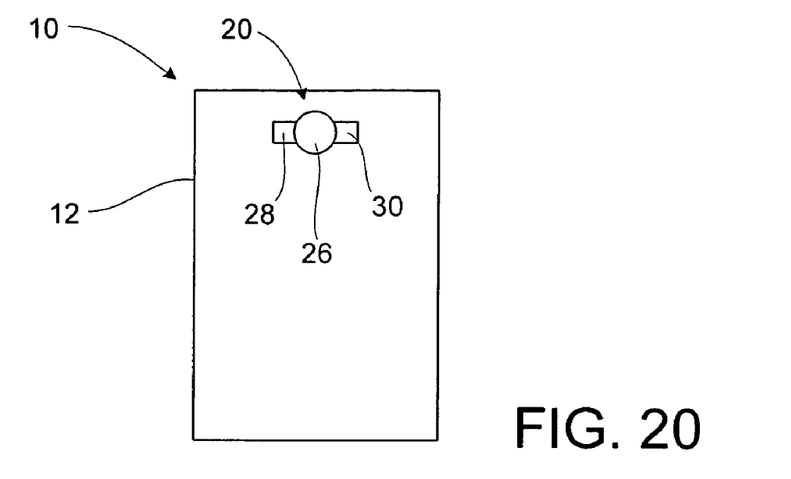
FIG. 20 is a bottom view of a second step of the method of FIG. 17.
Figure 21:
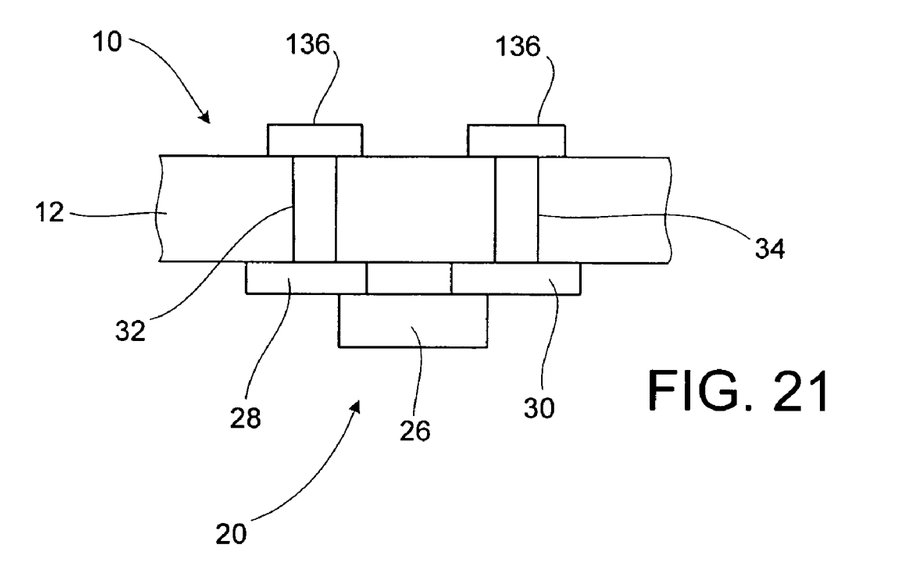
FIG. 21 is a side cross-sectional view of the second step.

In step 140, illustrated in FIGS. 20 and 21, the strap 20 is crimped onto the front surface 14 or the back surface 22 of the substrate 12. The crimping forms crimped connections 32 and 34 between conductive leads 28 and 30 of the strap 20, and elements of the conductive ink seed layer 136. The crimping may be performed in a similar manner to that as described above with regard to the crimping operation in the method 50a.

In step 150, electroplating is performed to produce the antenna or other conductive pattern 16. By suitable application of current within a suitable, ion-containing bath, material may be plated upon the seed layer 136, forming the antenna 16 of a suitable thickness.

After the electroplating, suitable steps may be taken to remove undesired plated areas. For example, acid may be used to remove additional material between desired elements of the antenna 16. It will be appreciated that no such removal is necessary when there is no additional conductive material between desired elements of the antenna 16.

It will be appreciated that steps of the method 50b may also be performed in one or more roll-to-roll operations. A system may be used to perform the roll-to-roll operations, with suitable printers, crimpers, and electroplating baths, which may be analogous to those described above with regard to the system 100 (FIG. 16).

The method 50, in its various embodiments, allows for inexpensive production of the RFID device 10, with its antenna 16 and strap 20 on opposite faces of the substrate 12. As described above, the electrical connection between the strap 20 and the antenna 16 may be a crimped connection through the substrate 12. Such a connection provides good mechanical strength, as well as being an efficient way to form a connection. It will be appreciated that the plating operation that occurs subsequent to the crimping may provide plated conductive material at connection points between the crimped connection and the parts of the antenna 16 and the strap 20 to be coupled together.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of making a radio frequency identification (RFID) device, the method comprising:

forming a conductive seed layer on a substrate; and attaching a strap to the substrate, wherein the attaching includes crimping to form crimped electrical connections between the seed layer and conductive leads of the strap;

wherein the crimped electrical connections pass through the substrate.

2. The method of claim 1, wherein the conductive seed layer is formed on a first face of the substrate; and wherein the strap is attached on a second face of the substrate that is on an opposite side from the first face.

3. The method of claim 1, wherein the strap is attached on the same side of the substrate as the conductive seed layer.

4. The method of claim 1, further comprising, after the attaching, plating on the seed layer to form a conductive pattern.

5. The method of claim 4, wherein the plating includes adding conductive plating material to the crimped electrical connections.

6. The method of claim 5, wherein the adding material includes thickening at least portions of the crimped connections.

7. The method of claim 5, wherein the adding material includes filling gaps between the crimped connections and the conductive leads.

8. The method of claim 5, wherein the adding material includes filling gaps between the crimped connections and the seed layer.

9. The method of claim 4, wherein the plating includes coupling the conductive leads to the seed layer.

10. The method of claim 1, wherein the crimping includes piercing the conductive leads, the substrate, and the seed layer, thereby displacing conductive material of the conductive leads and bringing the conductive material into contact with the seed layer.

11. The method of claim 10, wherein the crimping further includes forming crowns from the displaced conductive material, wherein the crowns are in contact with portions of the seed layer, thereby securing the strap to the substrate.

12. The method of claim 11, further comprising, after the attaching, plating on the seed layer to form a conductive pattern.

13. The method of claim 12, wherein the plating includes adding conductive plating material to the crimped electrical connections.

14. The method of claim 10, wherein the conductive seed layer is formed on a first face of the substrate; and wherein the strap is attached on a second face of the substrate that is on an opposite side from the first face.

15. The method of claim 10, wherein the strap is attached on the same side of the substrate as the conductive seed layer.

16. The method of claim 10, further comprising, prior to the crimping, making a hole in the substrate;

wherein the crimping includes placing a portion of the strap into the hole.

17. The method of claim 1, wherein the crimping includes driving metal rods through the conductive leads, the substrate, and the seed layer.

18. The method of claim 17, wherein the crimping further includes bending ends of the metal rods.

19. The method of claim 18, wherein the bending includes, for each of the rods, bending the ends against the seed layer and respective of the conductive leads.

20. The method of claim 17, further comprising, after the attaching, plating on the seed layer to form a conductive pattern.

21. The method of claim 20, wherein the plating includes adding conductive plating material to the crimped electrical connections.

22. The method of claim 17,
wherein the conductive seed layer is formed on a first face of the substrate; and
wherein the strap is attached on a second face of the substrate that is on an opposite side from the first face.

23. The method of claim 1, wherein the crimping includes:
making slits in the substrate and the seed layer;
passing the conductive leads of the strap through the slits; and
bending ends of the conductive leads that have been passed through the slits.

24. The method of claim 1, wherein the forming the seed layer includes depositing a conductive layer on the first face.

25. The method of claim 24, wherein the depositing includes vacuum deposition of a conductive material.

26. The method of claim 25, wherein the vacuum deposition includes vacuum deposition of copper.

27. The method of claim 25, wherein the depositing includes depositing the conductive material to a thickness of about 10,000 Angstroms or less.

28. The method of claim 24, further comprising forming a patterned dielectric mask layer over the conductive layer.

29. The method of claim 28, wherein the forming the patterned dielectric mask layer includes patterned printing of a dielectric material.

30. The method of claim 29, wherein the dielectric material is an alkaline-strippable material.

31. The method of claim 29, wherein the dielectric material includes an oil.

32. The method of claim 29, wherein the dielectric material includes a resist material.

33. The method of claim 29, wherein the dielectric material is a soluble material that is soluble in a suitable solvent.

34. The method of claim 28, further comprising, subsequent to the forming the patterned conductive layer, plating on the seed layer to form a conductive pattern.

35. The method of claim 34, further comprising, subsequent to the plating, removing the dielectric layer.

36. The method of claim 1, wherein the forming the seed layer includes printing a conductive ink on a first face of the substrate.

37. The method of claim 36, wherein the printing the conductive ink includes a patterned printing of the conductive ink.

* * * * *